United States Patent [19]

Stryker

[11] 3,922,712

[45] Nov. 25, 1975

[54] PLASTIC POWER SEMICONDUCTOR FLIP CHIP PACKAGE

[75] Inventor: Harry L. Stryker, Kokomo, Ind.

[73] Assignee: General Motors Corporation, Detroit, Mich.

[22] Filed: May 1, 1974

[21] Appl. No.: 465,820

[52] U.S. Cl. .................... 357/81; 357/70; 165/80
[51] Int. Cl.[2] .................... H01L 23/02
[58] Field of Search .................. 357/70, 81; 165/80

[56] References Cited

UNITED STATES PATENTS

| | | | |
|---|---|---|---|
| 3,153,750 | 10/1964 | Ackerman | 357/70 |
| 3,522,490 | 8/1970 | Kauffman | 357/70 |
| 3,628,483 | 12/1971 | Pauza | 357/70 |
| 3,646,409 | 2/1972 | Water et al. | 357/70 |
| 3,679,946 | 7/1972 | Buck et al. | 357/70 |
| 3,711,752 | 1/1973 | Nier | 357/81 |

*Primary Examiner*—Andrew J. James
*Attorney, Agent, or Firm*—Robert J. Wallace

[57] ABSTRACT

An economical plastic encapsulated package for a power semiconductor flip chip having a plurality of closely spaced contact bumps thereon. A thermally conductive base member for the package has a pedestal and at least two alignment bosses formed integral therewith. The pedestal has a surface configuration which precisely conforms to the back side of the flip chip. The flip chip is soldered to the pedestal and is automatically oriented by surface tension to position the contact bumps in a desired position relative to the alignment bosses. A lead frame structure having openings in a peripheral rim portion corresponding to the bosses, and a plurality of cantilevered convergent fingers corresponding to the contact bumps is mounted onto the alignment bosses. Interposition of the bosses in the lead frame openings automatically align and engage each closely spaced contact bump with its corresponding lead frame finger for bonding without requiring any further alignment of the flip chip or lead frame. A plastic encapsulation covers the flip chip. The peripheral rim portion of the lead frame is severed to provide direct electrical interconnection between the flip chip and external circuitry.

2 Claims, 4 Drawing Figures

PLASTIC POWER SEMICONDUCTOR FLIP CHIP PACKAGE

BACKGROUND OF THE INVENTION

This invention relates to semiconductor devices. More particularly, it relates to a plastic encapsulated package for a power semiconductor integrated circuit of the flip chip type.

Commercially available power semiconductor packages have mounted the integrated circuit die onto a heat sink and wire bonded specific areas on the die to leads for making electrical connection to external circuitry. For example, in U.S. Ser. No. 399,840, "Power Semiconductor Device Package," Harry L. Stryker, filed Sept. 24, 1973, and assigned to the same assignee as the present invention, the semiconductor die is mounted on a ceramic substrate. The external leads are soldered to pads on the substrate and small filamentary wires connect the desired areas on the die with their corresponding leads.

There has been developed a new type of semiconductor integrated circuit device called the flip chip. A flip chip is an integrated circuit die having a plurality of integral leads projecting from one face of the die. These integral leads, or contact bumps as they are commonly referred, are extensions of a conductor pattern on the die face and can be bonded directly to external leads without wire bonding. There can be up to about 20 contact bumps on a die only approximately 100 mils square. Hence, it can be envisioned that the contact bumps are extremely closely spaced from one another.

Due to the smallness of the contact bumps and the extremely close spacing therebetween, special alignment equipment is usually required to align the contact bumps with their corresponding leads of a lead frame structure. Even with such special alignment equipment, the alignment of the contact bumps with the leads is a time-consuming step in production. In production, it would be advantageous to provide a power semiconductor flip chip package that would be easily assembled with minimal number of steps in production. By eliminating as many steps as possible, increased productivity may result.

I have invented a power semiconductor flip chip package which provides easy assemblage without special alignment equipment. Disclosed herein is also a distinctive method of making an inexpensve but highly reliable package for a power semiconductor flip chip which facilitates easy assemblage. This inventive package minimizes the number of production steps by reducing the required number of elements needed to assemble the device into a finished marketable product.

Objects and Summary of the Invention

Therefore, it is an object of this invention to provide a package for a power semiconductor integrated circuit flip chip and a method of assembling it which does not require any special alignment equipment for aligning and bonding the chip contact bumps with their corresponding electrical interconnection leads.

It is a further object of this invention to provide a power semiconductor flip chip package and a method of making it which minimizes the number of steps in production thereby increasing productivity.

It is a further object of this invention to provide a plastic encapsulated power semiconductor flip chip package which reduces the number of discrete parts needed for assemblage of the completed package.

It is a further object of this invention to provide a method of packaging a power integrated circuit semiconductor flip chip which is easily adaptable to well known production processes.

These and other objects of this invention are accomplished by providing a sheet of a malleable, solderable and thermally conductive material serving as a base member. A pedestal and at least two alignment bosses spaced from the pedestal are formed on one surface of the base member, preferably by stamping. The pedestal periphery precisely conforms with the periphery of the semiconductor flip chip to be packaged. A solder preform is interdisposed between the pedestal and the back side of the flip chip. The subassembly is then heated to float the chip on the melted solder and automatically orient the chip by surface tension so that its periphery is congruent with the pedestal periphery. Hence, the closely spaced contact bumps on the front side of the chip are brought into a predetermined position relative to the alignment bosses. A unitary lead frame structure having a peripheral rim portion and a plurality of cantilevered inwardly extending finger portions corresponding to the contact bumps on the chip is mounted on the alignment bosses by interposing pin projections on the bosses with coaxially located openings on the lead frame rim portion. Thus, the lead frame finger portions are automatically aligned and brought into engagement with their respective flip chip contact bumps without requiring any further alignment of the chip or lead frame by special equipment. The contact bumps-lead frame finger portion engagement is then heated to solder the flip chip directly to the lead frame structure without necessitating wire bonding. A plastic encapsulation covering the flip chip provides a protective housing therefor. Preferably, the underside of the base member provides means for adhering the plastic to the base member to provide good mechanical connection thereto. The rim portion of the lead frame structure is severed to provide a plurality of discrete leads for making direct electrical interconnection to external circuitry.

BRIEF DESCRIPTION OF THE DRAWINGS

Other objects and advantages of the invention will become apparent upon reading the following detailed description and upon reference to the drawings, in which.

DESCRIPTION OF THE PREFERRED EMBODIMENT

Figures 1, 2, 3, 4:
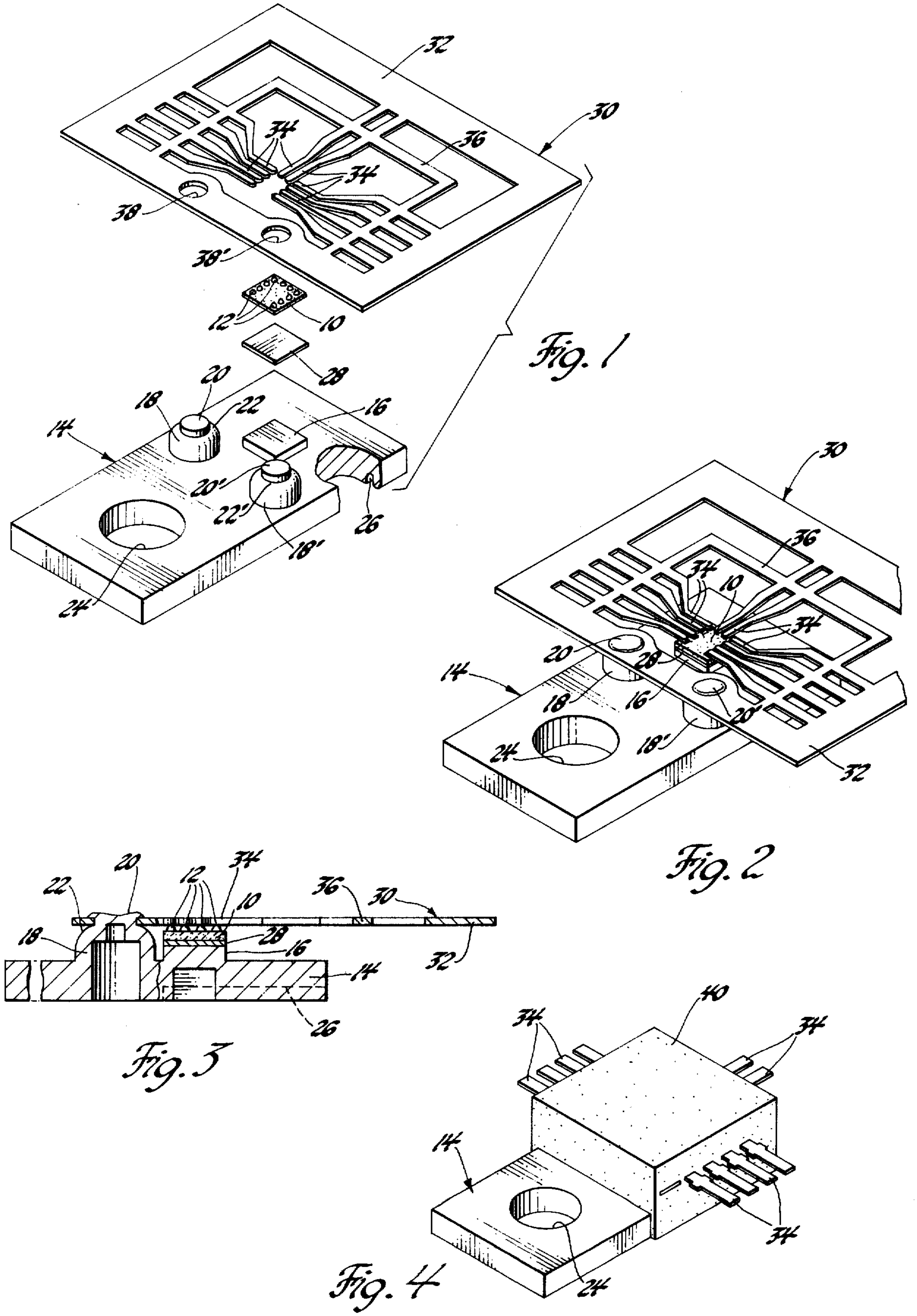
FIG. 1 shows an exploded isometric view with parts broken away of the partially assembled appartus of this invention.
FIG. 2 shows an isometric view of the assembled parts of FIG. 1.
FIG. 3 shows a partially fragmented sectional view of the assemblage of FIG. 2.
FIG. 4 shows an isometric view of one embodiment of the apparatus of this invention.

Returning first to FIG. 1, there is shown a power integrated circuit semiconductor flip chip 10. Flip chip 10 is an integrated circuit device die approximately 100 mils square and 5–7 mils thick between its major faces. The flip chip 10 has 10 spaced contact bumps equally spaced on three sides of the periphery on the front side of the chip. The contact bumps 12 as described in the Background of the Invention, are integral projections of a conductor pattern on the front side of the flip chip 10. For purposes of illustration, the contact bumps 12 are enlarged with respect to chip 10. However, it should be noted then that contact bumps 12 are in reality only about 5 mils in diameter and extend about 2 mils from the surface of the front side of the chip 10. It should be further emphasized that the contact bumps are spaced only about 20 mils from one another. Hence, it can be appreciated that the contact bumps 12 are extremely closely spaced on flip chip 10.

A rectangular solid sheet of malleable, solderable, and thermally conductive material serves as base member 14. Preferably, copper is used for base member 14 as it provides the above-stated requisites and is readily commercially available. A copper and aluminum laminate can also serve as base member 14. In this example, base member 14 is about ⅝ inch wide, ¾ inch long and 1/16 inch thick.

Pedestal 16 and alignment bosses 18 are integral extensions of base member 14. Pedestal 16 has an upper surface whose periphery precisely conforms with the periphery of flip chip 10. In accordance with this invention, the surface of pedestal 16 must not be smaller than the back side of flip chip 10 and can be only about 2% larger than the width of flip chip 10. In this example, pedestal 16 extends about 1/64 of an inch from the top surface of base member 14.

The two boss members 18 and 18' are spaced a given distance from pedestal 16. The alignment bosses 18 and 18' each include a coaxial pin projection 20 and 20', respectively. A shoulder 22 and 22' on the alignment bosses 18 and 18', respectively, define the pin projections 20 and 20'. As can be seen most clearly in FIG. 3, the height of the shoulder 22 is equivalent to combined heights of pedestal 16 and flip chip 10 inclusive of the contact bumps 12. Base member 14 also includes an opening 24 disposed at an opposite end of the base member. Opening 24 provides an opening for mounting the finished packaged semiconductor device at a desired location. Grooves 26 on the bottom of the base member 14 provide means for adhering the plastic encapsulation housing to be described later, thereby providing a good mechanical connection to the base member 14.

As emphasized above, the pedestal 16 and alignment bosses 18 and 18' are integral extensions of base member 14. Pedestal 16 and alignment bosses 18 and 18' are formed by a typical stamping operation. As can be seen in FIG. 3, corresponding indentations on the bottom of base member 14 depict the outline of a male punch forming tool. Similarly, a female anvil die cooperating with the stamping tool will be in the desired form of the pedestal and alignment bosses as described above. It should also be noted that opening 24 and grooves 26 can also be formed by the same stamping process. Hence, these elements can be all formed simultaneously in one process thereby minimizing the number of steps in production.

A solder preform 28 is placed on the pedestal 16. Solder preform 28 is an alloy containing about 10% lead, and 90% tin with a melting point of 415°F. As can be seen in FIG. 1, the solder preform 28 has a shape which is congruent with pedestal 16 and flip chip 10. The flip chip 10 is then placed on top of the solder preform 28. It is a feature of this invention that the flip chip 10 need not be precisely oriented with respect to pedestal 16. In fact, it has been found that the flip chip 10 can be as much as 30° rotation and 20% overhang out of alignment with the pedestal 16. Hence, the flip chip 10 can be expediently placed manually or mechanically without requiring precision placement thereon.

The pedestal 16, the flip chip 10 and solder preform 28 are then heated as by placing them in a furnace of about 450°F to melt the solder preform 28. The flip chip 10 floats on the melted solder and by surface tension automatically orients itself so that the periphery of the chip 10 and pedestal 16 are precisely congruent as can be seen most clearly in FIGS. 2 and 3. The heat is then removed to permanently bond the flip chip to the pedestal 16. By this procedure, the contact bumps 12 are brought into desired position relative to the alignment bosses 18. Thus, in the present embodiment, the contact bumps 12 will be automatically positioned in a precisely defined orientation relative to, yet spaced from, the alignment bosses 18 and 18'.

The lead frame structure 30 depicted in FIGS. 1 through 3 includes a peripheral rim portion 32 and a plurality of inwardly converging cantilevered finger portions 34. Pursuant to the invention, an inner rim portion 36 is also provided to add additional support for the finger portions 34. The lead frame structure 30 is constructed of Alloy 42 material, which is an alloy containing, by weight, about 41.5% nickel, 0.05% carbon, 0.5% manganese, 0.25% silicon, and the balance iron. Lead frame material is chosen so that it has a temperature coefficient of expansion similar to that of the silicon semiconductor flip chip 10. While Alloy 42 is a preferred lead frame structure material, other materials such as Kovar also can be used. The lead frame structure 30 is coated with a thin layer of solder (not shown) on both sides of the lead frame structure 30. This can be accomplished by known electroplating techniques. It has been found that by copper flashing the lead frame prior to application of the solder that the solder will adhere more uniformly to the lead frame. Further in accordance with this invention is that the solder coating on the lead frame structure 30 has a lower melting point than that of solder preform 28. In this preferred embodiment, the solder coating is an alloy of 30% lead and 70% tin, having a melting point of 370°F.

In the illustrated embodiment, it can be seen that the inner free end of lead frame fingers 34 are in a predetermined pattern which corresponds to the contact bump 12 pattern on semiconductor flip chip 10. Two openings 38 and 38' in the outer peripheral rim portion 32 coincide with the pin projections 20 and 20', respectively. The openings 38 and 38' are coaxial with the pin projections and have a diameter slightly larger than the diameter of pin projections 20 and 20', yet smaller than that of shoulder 22. The openings 38 and 38' can be formed by any suitable method as, for example, by drilling or stamping.

In carrying out our invention, the lead frame structure is mounted onto the shoulder 22 and 22' of bosses 18 and 18'. This is accomplished by merely placing the lead frame structure 30 so that the openings 38 and 38' fit around the pin projections 20 and 20' as can be seen most clearly in FIGS. 2 and 3. It is important to emphasize that by this simple procedure, the lead frame finger portions 34 are automatically aligned and engaged with their corresponding contact bump 12 of flip chip 10. As can be seen most clearly in FIG. 3, by resting the lead frame on the shoulder 22 and 22' of alignment bosses 18 and 18', the underside of lead frame structure 30 is automatically positioned in the plane of the contact bumps 12. Therefore, it can be appreciated that no special alignment equipment is needed in order to align and engage the lead frame finger portions 34 with the flip chip contact bumps 12.

It is a feature of this invention that the pin projections 20 and 20' can be crimped to hold the lead frame structure 30 in aligned engagement with the flip chip contact bumps 12 during successive steps in production. Since the pin projections 20 and 20' are an integral part of the malleable base member 14, they can be easily deformed simply by hitting them with a flat surface, such as a hammer. The subassembly as shown in FIGS. 2 and 3 is then heated in a nitrogen furnace to melt the solder coating on the lead frame structure 30 to permanently bond the flip chip contact bumps 12 to their respective finger portions 34 of the lead frame structure 30. It should be pointed out that since the solder coating on lead frame structure 30 has a lower melting point than that of solder preform 28, the above soldering process can be accomplished at a lower temperature of about 380°F so as not to melt the solder preform 28. Hence, the flip chip 10 remains in its previously oriented position.

Referring now to FIG. 4, an encapsulation 40 of plastic, preferably an epoxy thermosetting plastic, covers a major portion of the assembly as shown in FIG. 3. This plastic encapsulation can be accomplished by typical molding operations which are well known in the art.

For example, the plastic encapsulation 40 can be formed by injection molding. In this example, a thermosetting resin having a uniform expansion rate between −50°C and +150°C is chosen to meet specifications for automotive applications. A preferred resin is Epoxy B such as that distributed by Morton Chemical Company as No. 410. The resin is heated to about 300°C and forced at about 3000 psi into a mold surrounding the flip chip assembly to set the resin. The bottom of base member lies flat against one surface of the mold so that the plastic does not cover the bottom of the base member, except in the grooves 26 thereby providing a good mechanical connection for the plastic encapsulation 40. It should be noted that since the plastic encapsulation 40 does not cover the bottom of the base member this device provides a better heat sink than if the base member was entirely surrounded by the plastic.

After encapsulation, the peripheral rims 32 and 36 are sheared from the finger portions, leaving discrete spaced finger portion leads 34. Thus, in the present embodiment the finger portions 34 not only provide electrical connection to the flip chip 10, but also provide direct electrical connection to external circuitry as well. Hence, the number of elements required to make the interconnection is minimized thereby further reducing costs.

Thus, it is apparent that there has been provided, in accordance with this invention, a distinctive semiconductor package for a power integrated circuit flip chip that fully satisfies the objects, aims and advantages set forth above. The power flip chip package of this invention has the capability of dissipating greater than 10 watts of power from the flip chip.

From the preceding description of the preferred embodiment, it should be now apparent that this invention has minimized the number of discrete elements that are required for assemblage of a power semiconductor flip chip. By minimizing the number of elements required, costs as well as the man hours required for assemblage is substantially reduced. The automatic alignment feature of this invention further reduces the time of assemblage in production. Moreover, the apparatus and method embodied in this invention are easily adaptable to current well known production processes.

What is claimed is:

1. An economical and easily assembled package for a power semiconductor flip chip having a plurality of closely spaced contact bumps, said package comprising:

a base member of malleable, solderable and thermally conductive material, said base member having two major parallel surfaces;

a pedestal integral with said base member and extending from one surface thereof, said pedestal having a face parallel to said base member surface, said pedestal face having a rectangular geometry precisely conforming to the backside of a rectangular power semiconductor flip chip so that said chip can be automatically oriented thereon for alignment with a lead frame structure having a plurality of spaced inwardly converging cantilevered fingers corresponding to the contact bumps on the flip chip;

a layer of solder on the pedestal face;

a power semiconductor flip chip having a plurality of closely spaced contact bumps on the front side thereon, said flip chip being bonded to said pedestal in precise congruency therewith by said solder layer thereby providing a heat sink for the flip chip and automatically positioning said contact bumps in a predetermined location;

at least two alignment bosses integral with said base member and having integral pin projections extending from said one base member surface, said bosses being spaced from said pedestal, an integral shoulder on each of said bosses in the same plane defined by said flip chip contact bumps for engagement with said lead frame structure surrounding openings therein corresponding with said pins to automatically align and engage the lead frame fingers with the flip chip contact bumps;

a plurality of lead frame fingers corresponding to said flip chip contact bumps, said lead frame fingers having inner free end portions soldered to said contact bumps thereby providing direct electrical interconnection between said power semiconductor flip chip and external circuitry; and an encapsulation of plastic covering said flip chip to provide a protective housing therefor while leaving outer portions of said lead frame fingers uncovered so that they may provide direct electrical connections to external circuitry.

2. An economical and easily assembled semiconductor device package having a minimal number of discrete elements for packaging a power semiconductor flip chip having a plurality of closely spaced contact bumps thereon, said housing comprising:

a copper base member having malleable, solderable and thermally conductive characteristics, said base member having two major parallel surfaces;

a pedestal integral with said base member and upstanding on one surface thereof, said pedestal having a face parallel to said base member surface, said pedestal face having a rectangular geometry precisely conforming to the backside of a rectangular power semiconductor flip chip so that said chip can be automatically oriented thereon during soldering thereto for alignment with a lead frame structure having a plurality of spaced inwardly converging cantilevered fingers corresponding to contact bumps on the flip chip;

a layer of solder on the pedestal face, said solder layer having a given melting point;

a power semiconductor flip chip having a plurality of closely spaced contact bumps on the front side thereof; said flip chip being bonded to the pedestal in precise congruency therewith by said solder layer thereby providing a heat sink for the flip chip and automatically positioning said contact bumps in a predetermined location;

at least two alignment bosses integral with said base member and having integral pin projections extending from said one base member surface, said bosses being spaced from said pedestal, an integral shoulder on each of said bosses in the same plane defined by said flip chip contact bumps for engagement with said lead frame structure surrounding openings therein corresponding with said pins to automatically align and engage the lead frame fingers with the flip chip contact bumps; said pin projections being crimped over said lead frame structure so as to hold said lead frame fingers in registered engagement with said flip chip contact bumps;

a plurality of spaced inwardly converging lead frame fingers parallel to said pedestal face and corresponding to said flip chip contact bumps, said lead frame fingers having a solder coating thereon with a melting point below that of said solder layer on the pedestal, said lead frame fingers having inner free end portions soldered to said contact bumps thereby providing direct electrical interconnection between said power semiconductor flip chip and external circuitry;

grooves in the bottom of said base member extending to one end thereof;

an encapsulation of plastic covering said flip chip, inner portions of said lead frame fingers, part of said peripheral rim portion crimped to said bosses and extending into said grooves thereby providing mechanically locked protective plastic housing for said flip chip while leaving outer portions of said lead frame fingers uncovered to provide direct electrical connection to external circuitry.

* * * * *